United States Patent
Baskett

(10) Patent No.: US 7,119,618 B2
(45) Date of Patent: Oct. 10, 2006

(54) METHOD OF FORMING A WIDE BANDWIDTH DIFFERENTIAL AMPLIFIER AND STRUCTURE THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 64 days.

(21) Appl. No.: 11/009,584

(22) Filed: Dec. 13, 2004

(65) Prior Publication Data

US 2006/0125564 A1   Jun. 15, 2006

(51) Int. Cl.
*H03F 3/45* (2006.01)

(52) U.S. Cl. .................. 330/254; 330/261; 330/252

(58) Field of Classification Search ............... 330/252, 330/254, 261
See application file for complete search history.

(56) References Cited

U.S. PATENT DOCUMENTS

| | | | | |
|---|---|---|---|---|
| 4,219,781 A | * | 8/1980 | Naokawa | 330/254 |
| 4,331,929 A | * | 5/1982 | Yokoyama | 330/254 |
| 5,331,290 A | * | 7/1994 | Harford et al. | 330/254 |
| 6,172,566 B1 | * | 1/2001 | Nguyen | 330/254 |
| 6,794,915 B1 | * | 9/2004 | Goldgeisser et al. | 327/208 |

* cited by examiner

*Primary Examiner*—Patricia Nguyen
(74) *Attorney, Agent, or Firm*—Robert F. Hightower

(57) ABSTRACT

In one embodiment, a differential amplifier uses a diode coupled transistor and a series resistor to set a Voh output level and uses another transistor in parallel with the diode coupled transistor and resistor to set a Vol output level.

14 Claims, 4 Drawing Sheets

METHOD OF FORMING A WIDE BANDWIDTH DIFFERENTIAL AMPLIFIER AND STRUCTURE THEREFOR

BACKGROUND OF THE INVENTION

The present invention relates, in general, to electronics, and more particularly, to methods of forming semiconductor devices and structure.

In the past, the semiconductor industry utilized various structures and methods to produce differential amplifiers such as the differential amplifiers used for ECL and CML logic devices. In some cases, the differential amplifiers incorporated diode loads in the collectors of the differential pair transistors in order to improve the bandwidth of the differential amplifier. FIG. 1 schematically illustrates an example of a differential amplifier 100 that has diode loads 103 and 104 connected to the collectors of the differential pair transistors 101 and 102. However, the diode loads created a high impedance on the output 105 and 106 of the differential amplifier which degraded the bandwidth instead of increasing the bandwidth.

Additionally, the diode loads dropped voltage which reduced the amount of voltage available for use by the differential pair of the differential amplifier. The voltage drop also limited the use of the differential amplifier at low power supply voltage levels.

Accordingly, it is desirable to have a differential amplifier that has increased bandwidth, that has a lower output impedance, and that can operate at lower power supply voltage levels.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain NPN devices, a person of ordinary skill in the art will appreciate that complementary devices are also possible in accordance with the present invention.

DETAILED DESCRIPTION OF THE DRAWINGS

Figure 1:
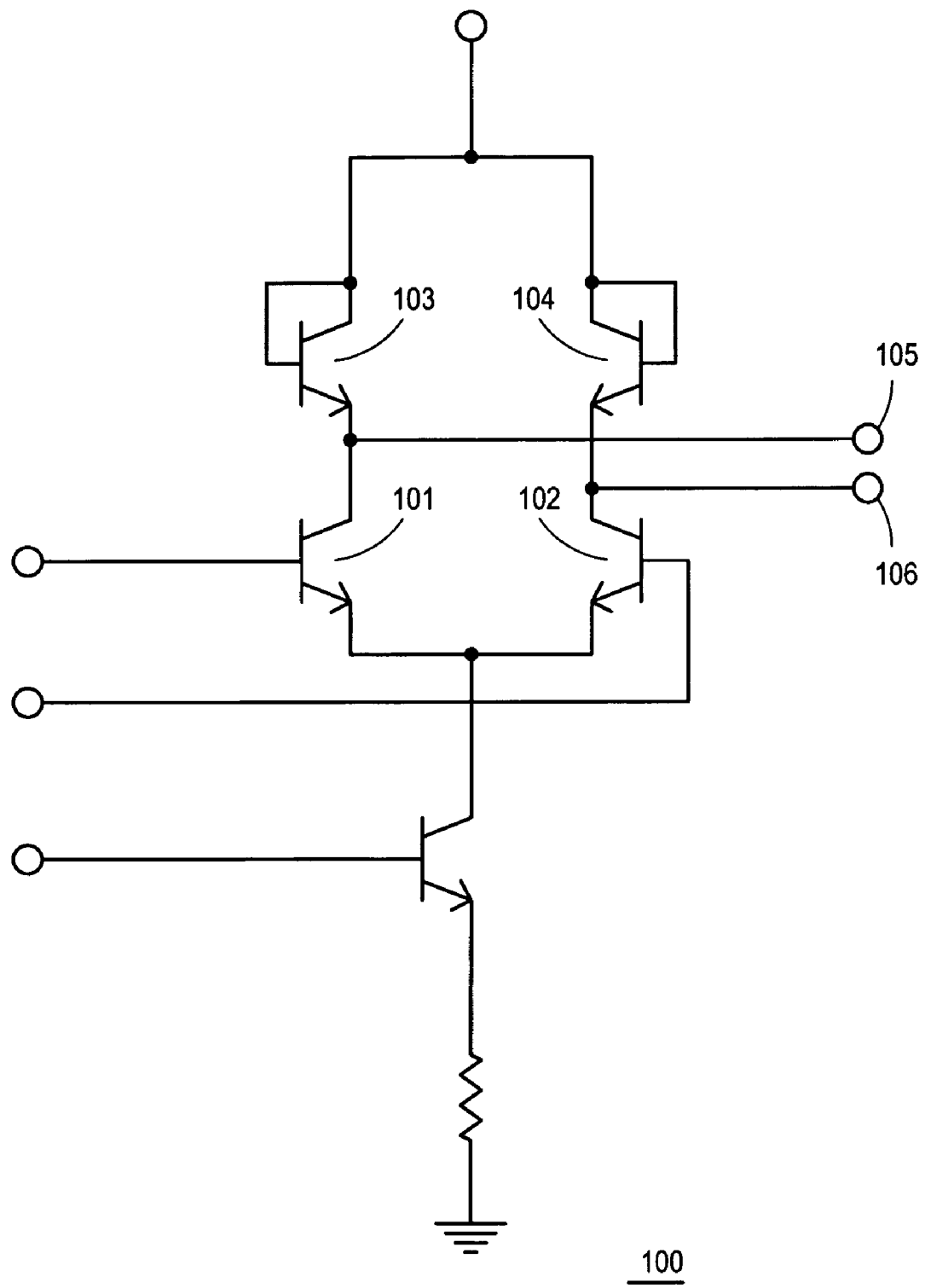
FIG. 1 schematically illustrates an example of a prior art differential amplifier with diode loads.
Figure 2:
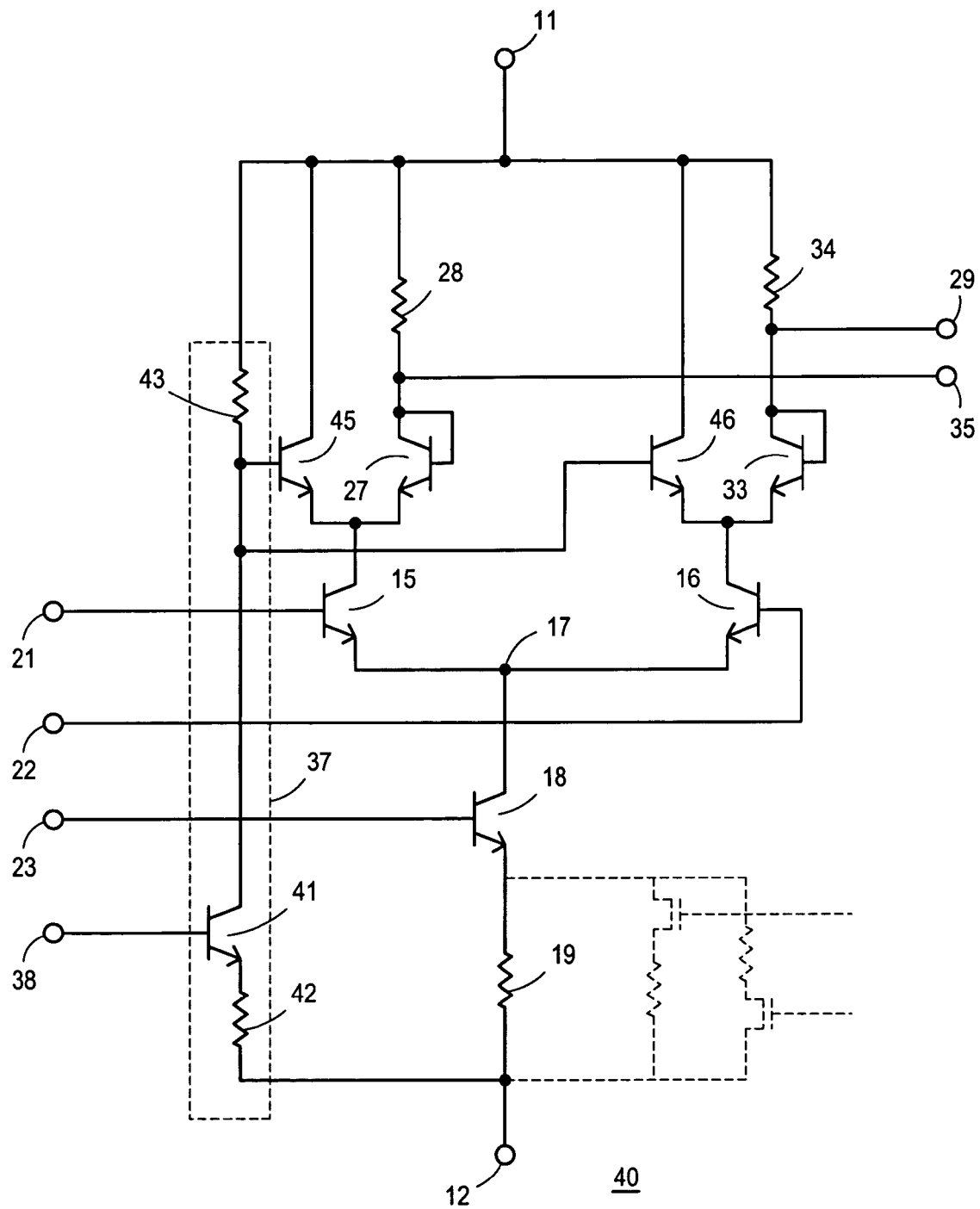
FIG. 2 schematically illustrates an embodiment of a portion of a differential amplifier in accordance with the present invention.

FIG. 2 schematically illustrates an embodiment of a portion of a differential amplifier 40 that has a wide band with, a low output impedance, and that facilitates changing the value of the switch current. In the preferred embodiment, amplifier 40 is configured to function as an ECL logic device. Amplifier 40 includes a first transistor 15 and a second transistor 16 that are configured as a differential pair of differential amplifier 40. Amplifier 40 also includes a first diode load coupled transistor 27, a second diode coupled load transistor 33, a first load transistor 45, a second load transistor 46, a current source transistor 18, a current source resistor 19, and a reference voltage generator 37. Amplifier 40 receives a source of power that is applied between a voltage input 11 and a voltage return 12. Transistors 15 and 16 are coupled to receive input signal from respective inputs 21 and 22 of amplifier 40. Amplifier 40 also receives a bias voltage on a bias input 23 that is used to set the value of the switch currents that flow through transistors 15 and 16. Such switch currents and bias voltages are well known to those skilled in the art.

Transistor 27 is coupled in series with a resistor 28 between the collector of transistor 15 and input 11 and establishes the value of the high state output voltage (Voh) on an output 35 of amplifier 40. Transistor 45 is coupled in parallel with transistor 27 and resistor 28 and is also coupled between the collector of transistor 15 and input 11. Transistor 45 functions to establish the value of the low state (Vol) of the output voltage on output 35. Similarly, transistor 33 is coupled in series with a resistor 34 between the collector of transistor 16 and input 11 and functions to establish the value of the high state output voltage (Voh) on an output 29 of amplifier 40. Transistor 46 is coupled in parallel with transistor 33 and resistor 34 between the collector of transistor 16 and input 11 and functions to establish the value of the low state (Vol) of the output voltage on output 29. Reference generator 37 includes a transistor 41 and resistors 42 and 43. Generator 37 receives a Vol bias voltage on an input 38 and responsively generates a reference voltage. As will be seen further hereinafter, the value of the Vol bias voltage assists in establishing the value of the low state (Vol) of the output voltage on outputs 29 and 35. The Vol bias voltage typically is a set voltage value that is formed by a bias voltage generator (not shown) and is applied to input 38. Current source 18 and resistor 19 are selected to establish the value of the switch current of transistors 15 and 16 thereby establishing the delay of amplifier 40.

As the value of the voltage on input 21 increases, transistor 15 conducts current causing diode 27 to begin conducting. As the input voltage continues to increase, the current flowing through resistor 28 and transistor 27 increases and the value of the voltage on output 35 decreases. As the value of input voltage continues to increase, the value of the collector voltage on the collector of transistor 15 continues to decrease. Transistor 45 remains non-conducting until the value of the collector voltage of transistor 15 decreases to a value that is greater than the reference voltage minus the base-emitter voltage (Vbe) of transistor 45. Since transistor 45 is configured as an emitter follower, transistor 45 begins conducting which clamps the collector of transistor 15 at the reference voltage minus the Vbe of transistor 45. As the value of the input voltage continues to increase, any additional current through transistor 15 is supplied by emitter follower coupled transistor 45.

Conversely, as the value of the voltage on input 21 decreases, transistor 15 begins to conduct less current. The collector voltage of transistor 15 remains substantially constant until decreasing past the value of the reference voltage minus the Vbe of transistor 45 and transistor 45 ceases to conduct. However, the diode of transistor 27 continues conducting. As the input voltage continues to decrease, transistor 15 conducts less current until the collector voltage of transistor 15 decreases sufficiently that transistor 27 ceases conducting and resistor 28 pulls output 35 to the Voh voltage that is approximately the supply voltage on input 11. Thus, in the high state transistor 27 isolates resistor 28 and output 35 from transistor 15.

Transistor 16 and transistors 46 and 33 function to control the Vol and Voh of the output voltage on output 29 similarly to transistors 15, 45, and 27, respectively in response to the input voltage applied to input 22 of amplifier 40.

It can be seen that the high state output impedance of outputs 29 and 35 is low and can easily drive the input of another ECL logic device. Also, transistor 45, along with the reference voltage from reference 37, establish the low state output voltage (Vol) on respective outputs 29 and 35 independently of the switch current that flows through transistor 15. Since the Vol and Voh levels are substantially independent of the value of the switch current, the value of the switch current can be changed without having a significant affect on the value of the Voh and Vol levels. For example the bias voltage on bias input 23 can be varied to vary the switch current or a variable voltage source can be used to form the voltage applied to transistor 18 or the value of resistor 19 can be changed, for example by switching in or out other resistors in parallel or series with resistor 19 as illustrated by elements shown in dashed lines.

In order to implement the functionality explained in the description of FIG. 2, a first terminal of resistor 28 is connected to input 11 and a second terminal is commonly connected to output 35 and to a collector and a base of transistor 27. An emitter of transistor 27 is commonly connected to a collector of transistor 15 and an emitter of transistor 45. A collector of transistor 45 is connected to input 11 and a base of transistor 45 is commonly connected to a first terminal of resistor 43, a collector of transistor 41, and a base of transistor 46. A second terminal of resistor 43 is connected to input 11. A base of transistor 41 is connected to receive the Vol reference voltage on input 38, and an emitter of transistor 41 is connected to a first terminal of resistor 42 which has a second terminal connected to return 12. A base of transistor 15 is connected to input 21 and an emitter is commonly connected to an emitter of transistor 16, node 17, and a collector of transistor 18. A base of transistor 18 is connected to bias input 23, and an emitter of transistor 18 is connected to a first terminal of resistor 19 which has a second terminal connected to return 12. A base of transistor 16 is connected to input 22, and a collector of transistor 16 is commonly connected to an emitter of transistor 46 and an emitter of transistor 33. A collector of transistor 46 is connected to input 11. A base and a collector of transistor 33 are connected to output 29 and a first terminal of resistor 34 which has a second terminal connected to input 11.

Figure 3:
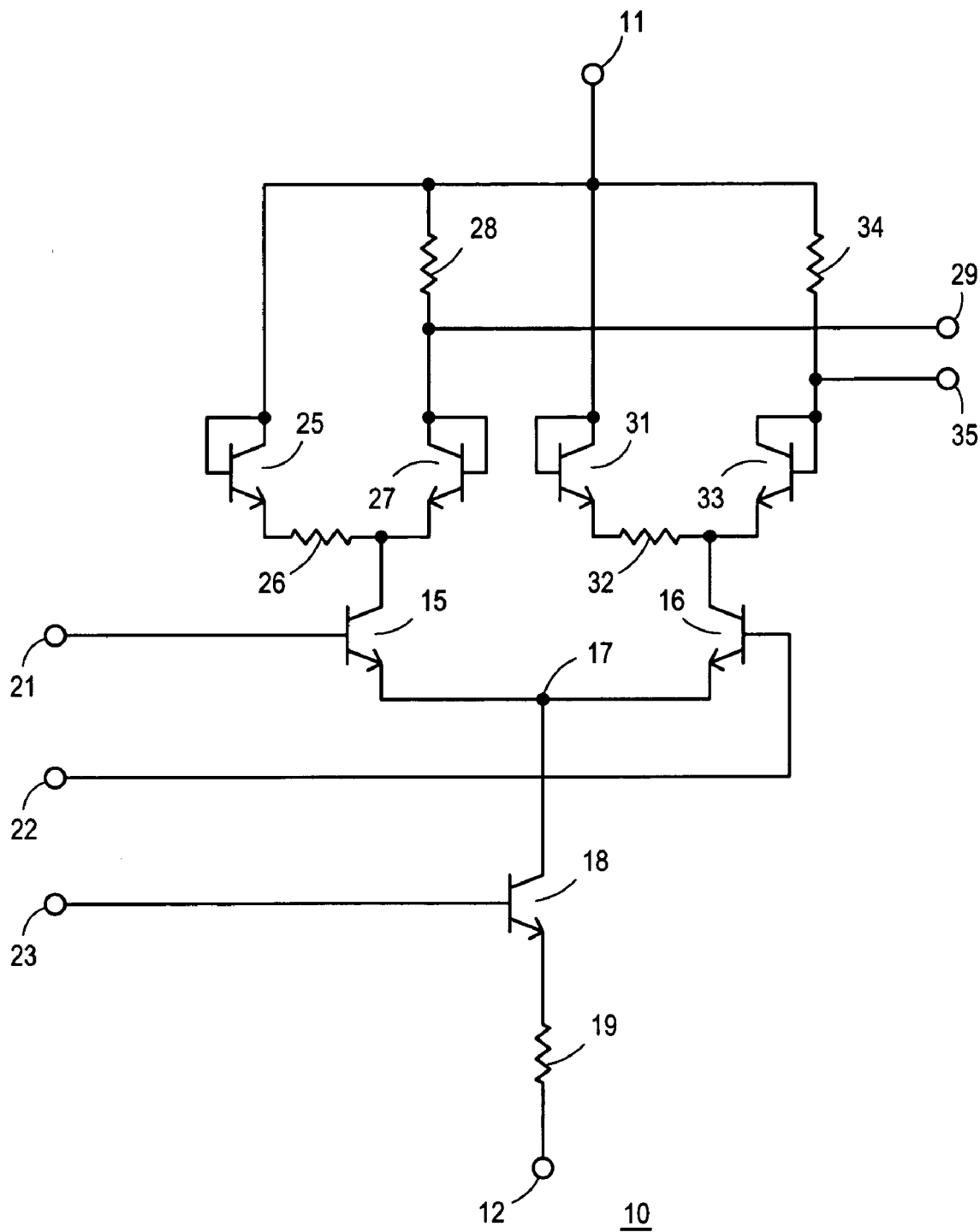
FIG. 3 schematically illustrates an embodiment of a portion of another differential amplifier in accordance with the present invention.

FIG. 3 schematically illustrates an embodiment of a portion of a differential amplifier 10 that is an alternate embodiment of amplifier 40 explained in the description of FIG. 2. Amplifier 10 includes a diode coupled transistor 25 and a series resistor 26 that replace transistor 45, and a diode coupled transistor 31 and a series resistor 32 that replace transistor 46.

The values of resistors 26 and 28 are selected to establish the value of the Vol state on output 29. The value of resistors 32 and 34 are similarly selected to establish the value of the Vol state on output 35. Using resistors 26 and 28 to set the respective Vol and Voh values facilitate changing the value of the switch current of amplifier 10 without substantially affecting the value of the Voh and Vol logic levels on output 29. Resistors 32 and 34 function similarly.

As the value of the voltage on input 21 increases, transistor 15 begins conducting current. AS the value of the collector voltage of transistor 15 decreases, transistors 25 and 27 begin conducting. If the value of resistor 26 is smaller than the value of resistor 28, transistor 25 conducts more current than transistor 27. As transistor 15 conducts more current, the voltage drop across resistor 26 becomes larger than the voltage drop across transistor 25. This continues until the current through resistors 26 and 28 equals the switch current of transistor 18. Since more current flows through resistor 26 the value of resistor 26 ratioed to the value of resistor 28 sets the value of the Vol state of output 29.

As the value of the input signal on input 21 decreases, transistor 15 conducts less current until transistors 25 and 27 turn-off and resistor 28 pulls output 29 to the Voh value that is approximately equal to the value of the voltage on input 11. Thus, the Voh and Vol values are set separately.

Transistors 31 and 33 along with resistors 32 and 34 function in response to the signal applied to input 22 to respective similarly transistors 25 and 27 along with respective resistors 26 and 28 in response to the signal applied to input 21.

In order to facilitate the functionality explained in the description of FIG. 3, a collector and a base of transistor 25 are connected to input 11, and an emitter of transistor 25 is connected to a first terminal of resistor 26 which has a second terminal commonly connected to the emitter of transistor 27 and the collector of transistor 15. Additionally, a collector and base of transistor 31 are connected to input 11, and an emitter of transistor 31 is connected to a first terminal of resistor 32 which has a second terminal connected to an emitter of transistor 33 and a collector of transistor 16.

Figure 4:
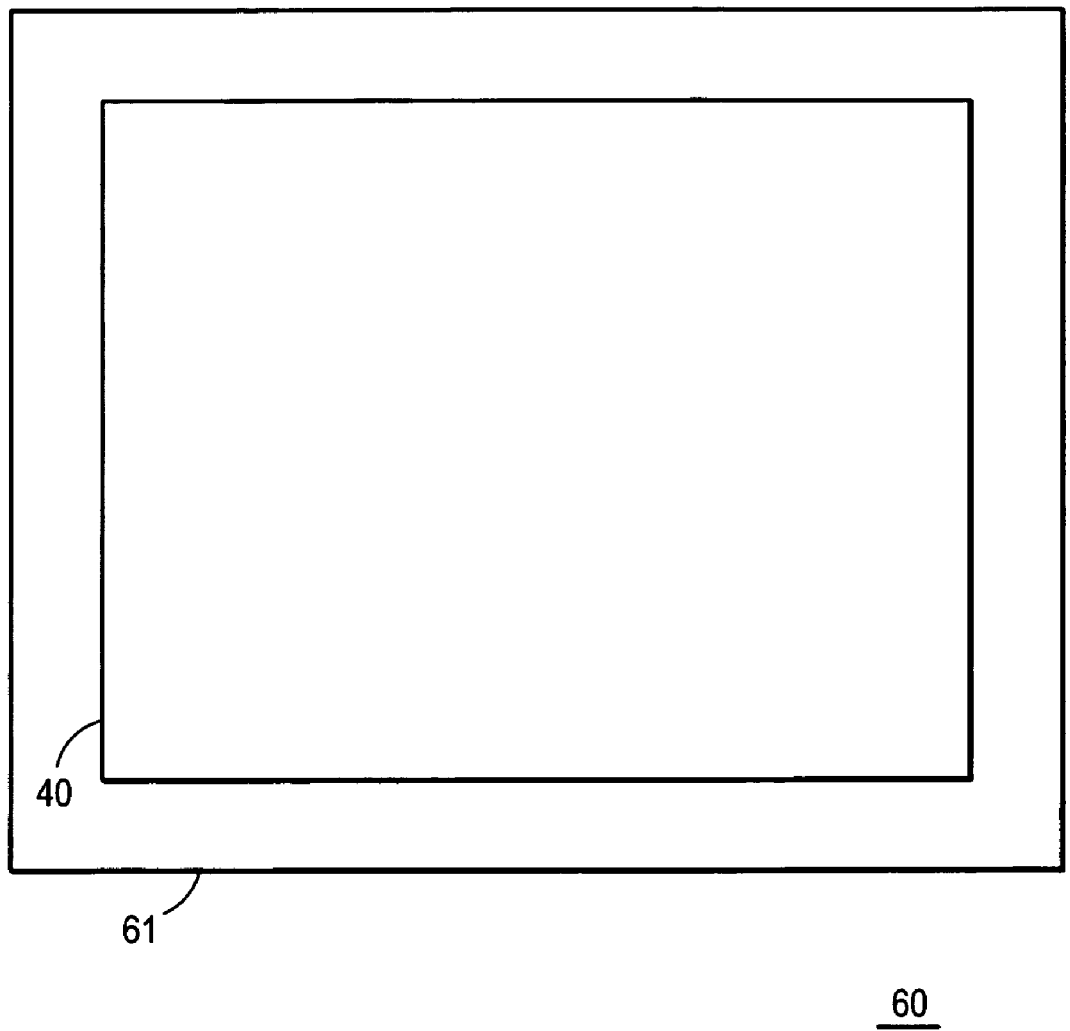
FIG. 4 illustrates a plan view of a semiconductor device that incorporates the differential amplifier of FIG. 1 or FIG. 2 in accordance with the present invention.

FIG. 4 schematically illustrates an enlarged plan view of a portion of an embodiment of a semiconductor device 60 that is formed on a semiconductor die 61. Amplifier 40 is formed on die 61. Die 61 may also include other circuits that are not shown in FIG. 4 for simplicity of the drawing. Amplifier 40 and device 60 are formed on die 61 by semiconductor manufacturing techniques that are well known to those skilled in the art.

In view of all of the above, it is evident that a novel device and method is disclosed. Included, among other features, is using a diode connected transistor in series with a resistor to set the Voh level of a differential amplifier and using another transistor coupled in parallel with the diode coupled transistor and resistor to set the Vol level. Using different transistors to set the different levels facilitates changing the switch current without substantially affecting the Voh and Vol levels. The parallel configuration also provides a low output impedance which increases the bandwidth of the differential amplifier. Translating the output signal up by a Vbe provides more head room for circuits that receive the output signal.

While the invention is described with specific preferred embodiments, it is evident that many alternatives and variations will be apparent to those skilled in the semiconductor arts. More specifically the invention has been described for a particular NPN transistor structure, although the method is directly applicable to other bipolar transistors, as well as to MOS, BiCMOS, metal semiconductor FETs (MESFETs), HFETs, and other transistor structures Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A differential amplifier having high and low states comprising:
   a first transistor having a first current carrying electrode, a second current carrying electrode, and a control electrode;
   a second transistor coupled to the first transistor to form a differential pair, the second transistor having a first current carrying electrode, a second current carrying electrode, and a control electrode;
   a first diode coupled transistor and a first resistor coupled between the first current carrying electrode of the first transistor and a power source;
   a first output of the differential amplifier coupled between the first diode coupled transistor and the first resistor;
   a third transistor coupled between the first current carrying electrode of the first transistor and the power source; and
   a fourth transistor coupled to the control electrode of the third transistor and configured to provide a bias voltage that sets the low state output voltage of the differential amplifier.

2. The differential amplifier of claim 1 further including a second resistor coupled to the control electrode of the third transistor and a first current carrying electrode of the fourth transistor, and a third resistor coupled between a second current carrying electrode of the fourth transistor and a power return.

3. The differential amplifier of claim 1 further including a second diode coupled transistor and a second resistor coupled between the first current carrying electrode of the second transistor and the power source, and a fifth transistor coupled between the first current carrying electrode of the second transistor and the power source.

4. The differential amplifier of claim 3 wherein the fifth transistor coupled between the first current carrying electrode of the second transistor and the power source includes the fifth transistor and a third resistor coupled between the first current carrying electrode of the second transistor and the power source.

5. The differential amplifier of claim 3 further including the fourth transistor coupled to the control electrode of the fifth transistor and configured to provide a bias voltage that sets the low output voltage of the differential amplifier.

6. The differential amplifier of claim 1 wherein the second current carrying electrode of the first transistor is coupled to the second current carrying electrode of the second transistor.

7. A method of forming a differential amplifier having high and low states comprising:
   coupling a first transistor and a second transistor as a differential pair of the differential amplifier;
   coupling a first diode coupled transistor to the first transistor to establish a high state level of an output of the differential amplifier;
   coupling a first output of the differential amplifier between the first diode coupled transistor and a first resistor; and
   coupling a second diode coupled transistor in parallel with the first diode coupled transistor to establish a low state level of the output of the differential amplifier.

8. The method of claim 7 wherein coupling the first diode coupled transistor to the first transistor to establish the high level of the output of the differential amplifier includes coupling the first diode coupled transistor and the first resistor between the first transistor and a power source.

9. A method of forming a differential amplifier having high and low states comprising:
   coupling a first transistor and a second transistor as a differential pair of the differential amplifier;
   coupling a first diode coupled transistor to the first transistor to establish a high state level of an output of the differential amplifier;
   coupling a first output of the differential amplifier coupled between the first diode coupled transistor and a first resistor; and
   coupling a third transistor to the first transistor to establish a low state level of the output of the differential amplifier wherein the third transistor and the first diode coupled transistor are coupled in parallel and a first current carrying electrode of the first transistor is coupled to a current carrying electrode of both the third transistor and the first diode coupled transistor.

10. The method of claim 9 wherein coupling the third transistor to the first transistor to establish the low level of the output of the differential amplifier includes configuring the third transistor to receive a bias voltage and responsively establish a value of the low level of the output of the differential amplifier.

11. The method of claim 10 wherein configuring the third transistor to receive the bias voltage and responsively establish the value of the low level of the output of the differential amplifier includes coupling the third transistor in parallel with the first diode coupled transistor.

12. The method of claim 9 wherein coupling the third transistor to the first transistor to establish the low level of the output of the differential amplifier includes coupling a second diode coupled transistor in parallel with the first diode coupled transistor.

13. The method of claim 7 further including coupling a third diode coupled transistor to the second transistor to establish a high level of another output of the differential amplifier; and
   coupling a third transistor to the second transistor to establish a low level of the another output of the differential amplifier.

14. The method of claim 13 further including coupling the third transistor and the third diode coupled transistor in parallel and coupling a first current carrying electrode of the second transistor to a current carrying electrode of both the third transistor and the third diode coupled transistor.

* * * * *